United States Patent
Wessendorf

(10) Patent No.: US 7,183,868 B1
(45) Date of Patent: Feb. 27, 2007

(54) TRIPLE INVERTER PIERCE OSCILLATOR CIRCUIT SUITABLE FOR CMOS

(75) Inventor: Kurt O. Wessendorf, Albuquerque, NM (US)

(73) Assignee: Sandia Corporation, Albuquerque, NM (US)

(*) Notice: Subject to any disclaimer, the term of this patent is extended or adjusted under 35 U.S.C. 154(b) by 26 days.

(21) Appl. No.: 10/937,163

(22) Filed: Sep. 9, 2004

(51) Int. Cl.
  *H03B 5/32* (2006.01)
(52) U.S. Cl. ................... 331/158; 331/116 FE
(58) Field of Classification Search ........... 331/158, 331/116 FE
  See application file for complete search history.

(56) References Cited

U.S. PATENT DOCUMENTS

| | | | |
|---|---|---|---|
| 5,142,251 A | 8/1992 | Boomer | |
| 5,416,448 A | 5/1995 | Wessendorf | |
| 5,528,201 A * | 6/1996 | Davis | 331/116 FE |
| 5,914,643 A | 6/1999 | Tinsley et al. | |
| 6,268,776 B1 | 7/2001 | Faison et al. | |
| 6,556,094 B2 * | 4/2003 | Hasegawa et al. | 331/158 |
| 6,741,137 B1 | 5/2004 | Sibrai et al. | |
| 6,759,914 B2 | 7/2004 | Rusznyak | |
| 2004/0090279 A1 * | 5/2004 | Seki | 331/158 |

OTHER PUBLICATIONS

Kurt Wessendorf and Tom Payne, "Oscillator design techniques allow high-frequency applications," Mar. 1998 RF Design magazine.

* cited by examiner

*Primary Examiner*—Joseph Chang
(74) *Attorney, Agent, or Firm*—John P. Hohimer

(57) ABSTRACT

An oscillator circuit is disclosed which can be formed using discrete field-effect transistors (FETs), or as a complementary metal-oxide-semiconductor (CMOS) integrated circuit. The oscillator circuit utilizes a Pierce oscillator design with three inverter stages connected in series. A feedback resistor provided in a feedback loop about a second inverter stage provides an almost ideal inverting transconductance thereby allowing high-Q operation at the resonator-controlled frequency while suppressing a parasitic oscillation frequency that is inherent in a Pierce configuration using a "standard" triple inverter for the sustaining amplifier. The oscillator circuit, which operates in a range of 10–50 MHz, has applications for use as a clock in a microprocessor and can also be used for sensor applications.

27 Claims, 9 Drawing Sheets

"Prior Art"

TRIPLE INVERTER PIERCE OSCILLATOR CIRCUIT SUITABLE FOR CMOS

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to oscillator circuits, and in particular to a triple inverter Pierce oscillator circuit formed with field-effect transistors (FETs) which is designed to prevent any parasitic oscillation. The crystal oscillator circuit can be formed using discrete components, or as a complementary metal oxide semiconductor (CMOS) integrated circuit which includes all components except for a resonator.

BACKGROUND OF THE INVENTION

It is desirable to form medium to low precision quartz resonator controlled oscillators using CMOS circuitry, especially when such oscillators are to be used as clocks for microprocessors. Such CMOS oscillators generally utilize a single inverter stage (i.e. a single CMOS inverter) for the oscillator, and another inverter stage as an isolation buffer and gain amplifier. A Pierce oscillator circuit formed in CMOS using a single inverter stage is shown in FIG. 1.

At frequencies in the tens of megaHertz (MHz), the Pierce oscillator circuit of FIG. 1 has a relatively low circuit impedance thereby requiring a correspondingly high transconductance for the single inverter for reliable operation. Typically 10 deciBells (dB) of excess gain is desirable. However, a single CMOS inverter stage cannot provide enough transconductance to achieve this level of excess gain which is needed for reliable operation.

Typically to overcome this gain limitation, a triple inverter chain is used as the sustaining amplifier. However, such a triple inverter chain, when used in a Pierce oscillator configuration, allows a parasitic oscillation and provides a low operating Q for the desired quartz resonator controlled mode. The parasitic oscillation, which occurs at frequencies other than that of the quartz resonator, arises from the increased gain and additional poles supplied by the multiple inverter stages. This parasitic oscillation can severely degrade the reliability of the oscillator, and produces an erratic start-up behavior.

The present invention represents an advance in the art by eliminating the parasitic oscillation problems which have heretofore prevented the use of three inverter stages in a CMOS or FET Pierce oscillator circuit. This allows the fabrication of triple-inverter Pierce oscillator circuits which can operate at frequencies that are generally in the range of 10–50 MHz or more. The present invention is applicable to fabrication of a triple-inverter Pierce oscillator circuit as a low-voltage CMOS integrated circuit.

The triple-inverter Pierce oscillator circuit of the present invention can be formed using discrete components, or as a CMOS integrated circuit which includes all circuit components except for the resonator.

The triple-inverter Pierce oscillator circuit of the present invention has applications for use in forming a clock for a microprocessor or other integrated circuitry, or can be used in resonator sensing applications wherein a resonator loading changes over time due to a sensed chemical species which contacts a surface of the resonator, or which produces a mass accumulation thereon.

These and other advantages of the present invention will become evident to those skilled in the art.

SUMMARY OF THE INVENTION

The present invention relates to a CMOS oscillator circuit for use with a resonator, which is connected in a feedback configuration between an input and an output of the CMOS oscillator circuit. The CMOS oscillator circuit comprises three serially-connected CMOS inverters, with each CMOS inverter having an input and an output, and with the output of a first CMOS inverter being connected to the input of a second CMOS inverter, and with the output of the second CMOS inverter being connected to the input of a third CMOS inverter. A first feedback resistor is connected between the output of the third CMOS inverter, which generally forms the output of the CMOS oscillator circuit, and the input of the first CMOS inverter, which forms the input of the CMOS oscillator circuit. A second feedback resistor is connected between the output of the second CMOS inverter and the input of the second CMOS inverter to prevent any parasitic oscillation in the CMOS oscillator circuit. A first capacitor is connected at one side thereof to the input of the CMOS oscillator circuit, and at another side thereof to a voltage supply rail (e.g. a ground rail); and a second capacitor is connected at one side thereof to the output of the CMOS oscillator circuit, and at another side thereof to the same voltage supply rail.

By supplying significant resistive feedback in the second inverter stage, the input and output impedance for this stage become real instead of capacitive. This resistive feedback also significantly reduces an overall gain for the three inverter stages. However, with the three inverter stages, there is more than enough gain so that trading off even as much as 20 dB or more of gain for improved phase characteristics is possible, and is a wise choice to prevent the possibility for parasitic oscillation. As a result, with significant resistive feedback in the second inverter stage, the three-inverter Pierce oscillator circuit of the present invention begins to approach the behavior of an ideal, high gain single-inverter Pierce oscillator circuit which is not realizable in practice when implemented in CMOS.

The first feedback resistor generally has a resistance in the range of 10–100 kiloOhms (kΩ); and the second feedback resistor generally has a resistance in the range of 1–100 kΩ. Each capacitor can have a capacitance that is generally 100 picoFarads (pF) or less. The second capacitor can be optionally connected to the output of the CMOS oscillator circuit through a voltage-limiting resistor (e.g. with a resistance of generally 1–10 kΩ). The resonator can comprise a crystal resonator (e.g. an AT-cut quartz resonator), with an oscillation frequency produced by the CMOS oscillator circuit generally being in the range of 10–50 megaHertz (MHz).

Each CMOS inverter can comprise an N-channel metal-oxide-semiconductor (NMOS) transistor and a P-channel metal-oxide-semiconductor (PMOS) transistor connected in a common gate, common drain configuration. Means for biasing the NMOS and PMOS transistors within the third CMOS inverter with a direct-current (dc) bias current can be optionally provided in the CMOS oscillator circuit. The means for biasing can comprise, for example, a current source connected to each NMOS and PMOS transistor within the third CMOS inverter.

The three serially-connected CMOS inverters, the first and second feedback resistors, and the first and second capacitors can all be formed as an integrated circuit, with the resonator being located off the integrated circuit (i.e. off a chip wherein the integrated circuit is formed). Each feedback resistor in the integrated circuit can comprise a polysilicon resistor.

The present invention further relates to an oscillator circuit, capable of generating a resonator-controlled oscillator output signal, which comprises three field-effect transistor (FET) inverter stages, with each FET inverter stage having an input and an output, and with the three FET inverter stages being connected in series with the output of a first FET inverter stage being connected to the input of a second FET inverter stage, and with the output of the second FET inverter stage being connected to the input of a third FET inverter stage. A first feedback resistor is connected between the output of the third FET inverter stage and the input of the first FET inverter stage to bias the oscillator circuit for start-up of oscillation; and a second feedback resistor is connected between the output of the second FET inverter stage and the input of the second FET inverter stage to prevent parasitic oscillation of the oscillator circuit. A first capacitor is connected between the input of the first FET inverter stage and a voltage supply rail (generally a ground rail); and a second capacitor is connected between the output of the third FET inverter stage and the same voltage supply rail. A resonator is connected between the first and second capacitors to control an oscillation frequency of the circuit, with the generated resonator-controlled oscillator output signal being provided at the output of the second or third FET inverter stage. The resonator can comprise a crystal resonator (e.g. an AT-cut quartz resonator) to produce an oscillation frequency which is preferably in the range of 10–50 megaHertz (MHz), although the oscillator circuit is capable of operating at lower oscillation frequencies.

For use in the 10–50 MHz oscillation frequency range, the first feedback resistor can have a resistance of 10–100 k$\Omega$; and the second feedback resistor can have a resistance of 1–100 k$\Omega$. Each capacitor can have a capacitance of 100 pF or less. A voltage-limiting resistor having a resistance of 1–10 k$\Omega$ can optionally be used to connect the second capacitor and resonator to the output of the third. FET inverter stage to limit a power dissipation in the resonator.

Each FET inverter stage can comprise an N-channel field-effect transistor (NFET) and a P-channel field-effect transistor (PFET) connected in a common gate and common drain configuration. Means can also be provided in the oscillator circuit for biasing each transistor within the third FET inverter stage with a dc bias current. This biasing means can comprise a current source connected to provide the dc bias current to each transistor within the third FET inverter stage.

The three FET inverter stages, the first and second feedback resistors, and the first and second capacitors can all be formed using discrete devices or, in preferred embodiments of the present invention, can be formed as an integrated circuit. When the oscillator circuit is formed as a complementary metal-oxide-semiconductor (CMOS) integrated circuit, each FET inverter stage can comprise an NMOS transistor and a PMOS transistor connected together in a common gate, common drain configuration. Each feedback resistor can also comprise a polysilicon resistor. The resonator is generally located off the integrated circuit.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings:

FIG. 3 also shows an equivalent circuit for the resonator $Y_1$.

DETAILED DESCRIPTION OF THE INVENTION

Figure 1:
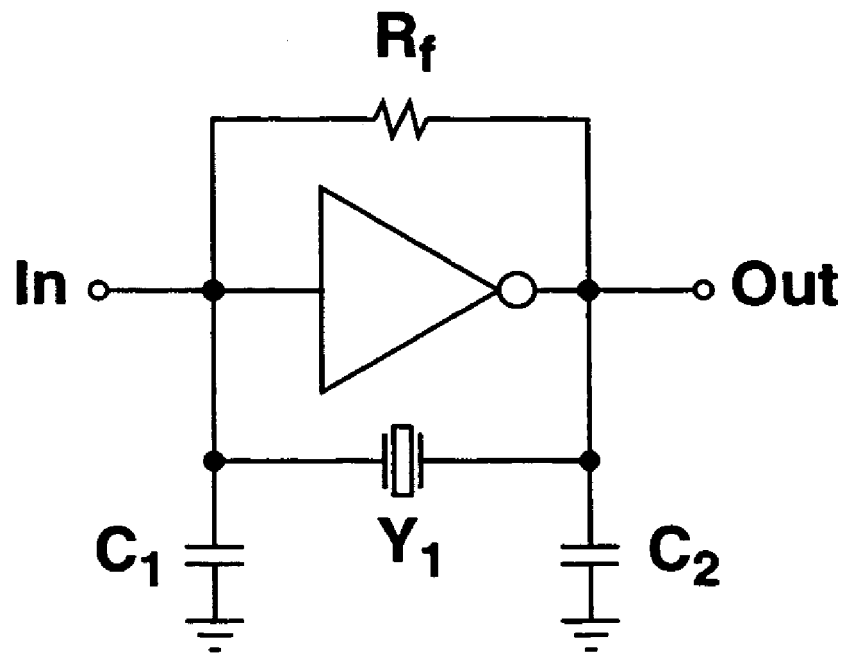
FIG. 1 shows a schematic diagram of a prior art single-inverter Pierce oscillator circuit.

Referring to FIG. 1, there is shown a single-inverter Pierce oscillator circuit as known in the prior art. The oscillator circuit of FIG. 1 utilizes a single inverter which can be implemented using N-channel and P-channel field-effect transistors (FETs). A resonator $Y_1$ is embedded between two capacitors $C_1$ and $C_2$ and further connected between the output of the circuit and the input thereof to provide a feedback path for oscillation at an oscillation frequency which is defined by the resonator $Y_1$. A feedback resistor $R_f$, with a value in the range from 100 kΩ up to a few megaOhms (MΩ), is provided between the input and output of the oscillator circuit to bias the oscillator circuit for start-up.

The single-inverter Pierce oscillator circuit of FIG. 1 works relatively well for relatively-high-transconductance FETs, and for a relatively low-frequency, low-loss resonator $Y_1$. Additionally, the capacitors $C_1$ and $C_2$ must be carefully chosen to provide for adequate excess loop gain which is generally on the order of 10–15 dB. The oscillator circuit of FIG. 1, however, is problematic for fabrication using complementary metal oxide semiconductor (CMOS) technology due to the low transconductance of CMOS transistors which may not provide sufficient excess loop gain for stable, dependable operation with a wide range of resonator loss and frequency of operation.

Figure 2:
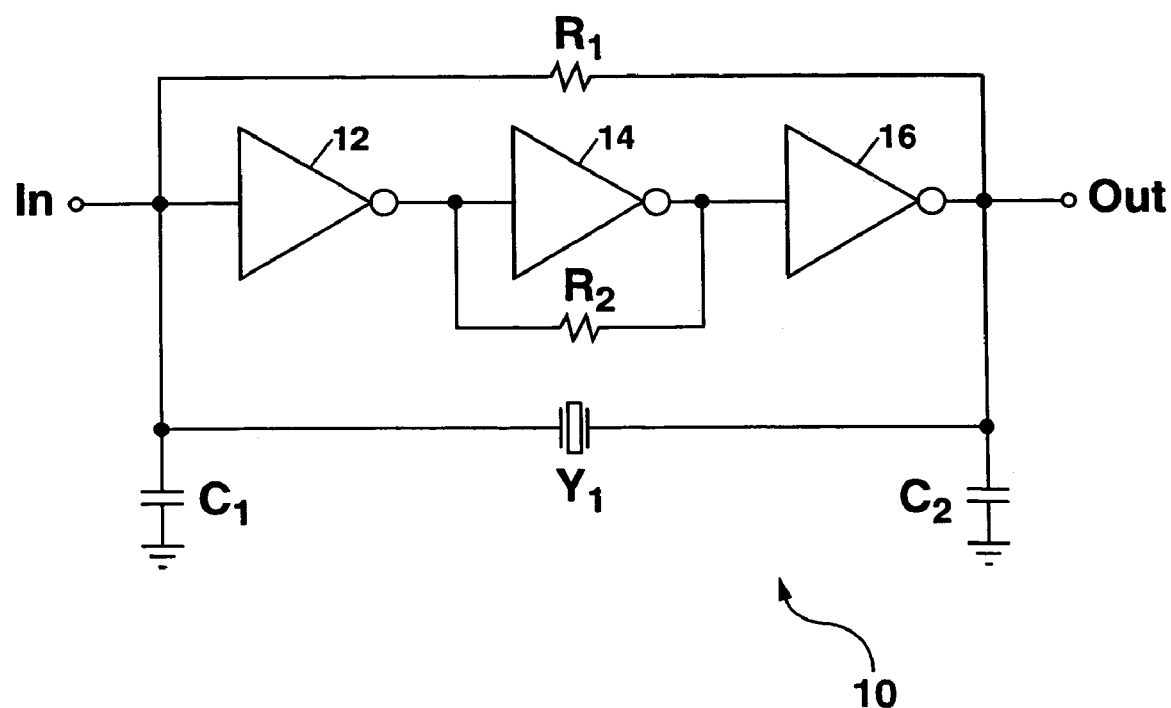
FIG. 2 shows an embodiment of a triple-inverter Pierce oscillator circuit according to the present invention.

FIG. 2 shows a triple-inverter Pierce oscillator circuit 10 according to the present invention. The oscillator circuit 10 of FIG. 2 comprises three FET inverter stages (also referred to herein as inverters) 12, 14 and 16, with each inverter stage having an input and an output. The input of a first inverter stage 12 forms the input of the oscillator circuit 10 (labelled "In" in FIG. 2) to which one side of a resonator $Y_1$ is connected. The output of the first inverter stage 12 is series connected to the input of a second inverter stage 14; and the output of the second inverter stage 14 is series connected to the input of a third inverter stage 16. The output of the third inverter stage 16 to which the other side of the resonator $Y_1$ is connected forms the output of the oscillator circuit 10 (labelled "Out" in FIG. 2, and also referred to herein as an oscillator output signal). Capacitors $C_1$ and $C_2$ are located on either side of the resonator $Y_1$, and together with the resonator $Y_1$ provide a feedback loop between the output and input of the oscillator circuit 10 with positive feedback that causes the circuit 10 to oscillate and which defines a resonator-controlled oscillation frequency for the circuit 10.

In FIG. 2, a first feedback resistor $R_1$ is also connected from the output of the oscillator circuit 10 to the input thereof. The resistor $R_1$ provides a direct current (dc) negative feedback to bias the gate of the first inverter stage 12 in a linear range so that start-up of oscillation in the circuit 10 can occur when power is applied. The resistor $R_1$ can have a resistance that is generally in the range of 10–100 kiloOhms (kΩ). In some cases, to enhance circuit recovery from transient charge accumulation effects (e.g. due to ionizing radiation) which can affect biasing at the input of the first inverter stage 12, the resistor $R_1$ can be split into two unequal components (e.g. 20 kΩ connected to the output of the circuit 10 in series with 2 kΩ connected to the input of the circuit 10) with a relatively large capacitor (e.g. $10^4$ pF) connected between ground and an point where the two resistors are connected together (see FIG. 4). This provides for a relatively rapid discharge of any transient charge at the input of the first inverter stage 12, thereby restoring a proper dc biasing of the oscillator circuit 10.

A second feedback resistor $R_2$ is connected between the output of the second inverter stage 14 and the input thereof in FIG. 2. The resistor $R_2$, which can have a resistance of, for example, 1–100 kΩ and typically 5–25 kΩ, is utilized to provide a shunt current path across the second inverter stage 14. According to the present invention, the use of the second feedback resistor $R_2$ prevents parasitic oscillation of the circuit 10 of FIG. 2 by mitigating the effect of a gate-to-drain capacitance within the second inverter stage 14 which is effectively multiplied by the gain (i.e. transconductance) of the second inverter stage 14 due to a "Miller" effect, and also by lowering a transconductance gain of the second inverter stage 14.

In the absence of $R_2$, the gate capacitance of the second inverter stage 14 is multiplicatively increased by the transistor gain of the second inverter stage 14 due to the "Miller" effect, thereby producing a relatively large value of a "Miller" effect capacitance which loads the output of the first inverter stage 12, and which also presents a relatively large input capacitance for the second inverter stage 14. The presence of the "Miller" effect capacitance in a three-inverter Pierce oscillator circuit forces a phase shift across the first inverter stage 12 to be less than an ideal phase shift of 180°. The phase shift across the second inverter stage 14 also is less than the ideal phase shift of 180° due to the "Miller" effect capacitance, and also due to a loading on the output of the second inverter stage 14 produced by the third inverter stage 16. As a result, without $R_2$ an overall phase shift produced by the three inverter stages connected in series as shown in FIG. 2 can be 360° (equivalent to 0°) at some frequency within a bandwidth of the oscillator circuit, and this, together with a relatively high gain produced by the three inverter stages in series, can result in a parasitic oscillation at a zero-phase crossing frequency which is generally higher than a resonant frequency of the resonator $Y_1$.

The second feedback resistor $R_2$ dominates a gate-to-drain impedance in the second inverter stage 14, thereby providing a nearly ideal inverting transconductance for this inverter stage 14, and also for the first inverter stage 12. As a result, an overall phase shift produced by the three inverter stages 12, 14 and 16 is more nearly ideal, and any zero-phase crossing frequency is shifted upward in frequency to a point where the overall gain of the oscillator circuit is much smaller and preferably negative (i.e. corresponding to a loss). Thus, the effect of $R_2$ when properly sized is to prevent the possibility of any parasitic oscillation in the oscillator circuit 10 of the present invention. Additionally, with $R_2$ in the oscillator circuit 10, the transconductance gain of the second inverter stage 14 is reduced at the zero-phase crossing frequency to further prevent any parasitic oscillation, while still providing more than adequate excess gain for the circuit 10 to operate at the oscillation frequency as determined by the resonator $Y_1$.

Figure 3:
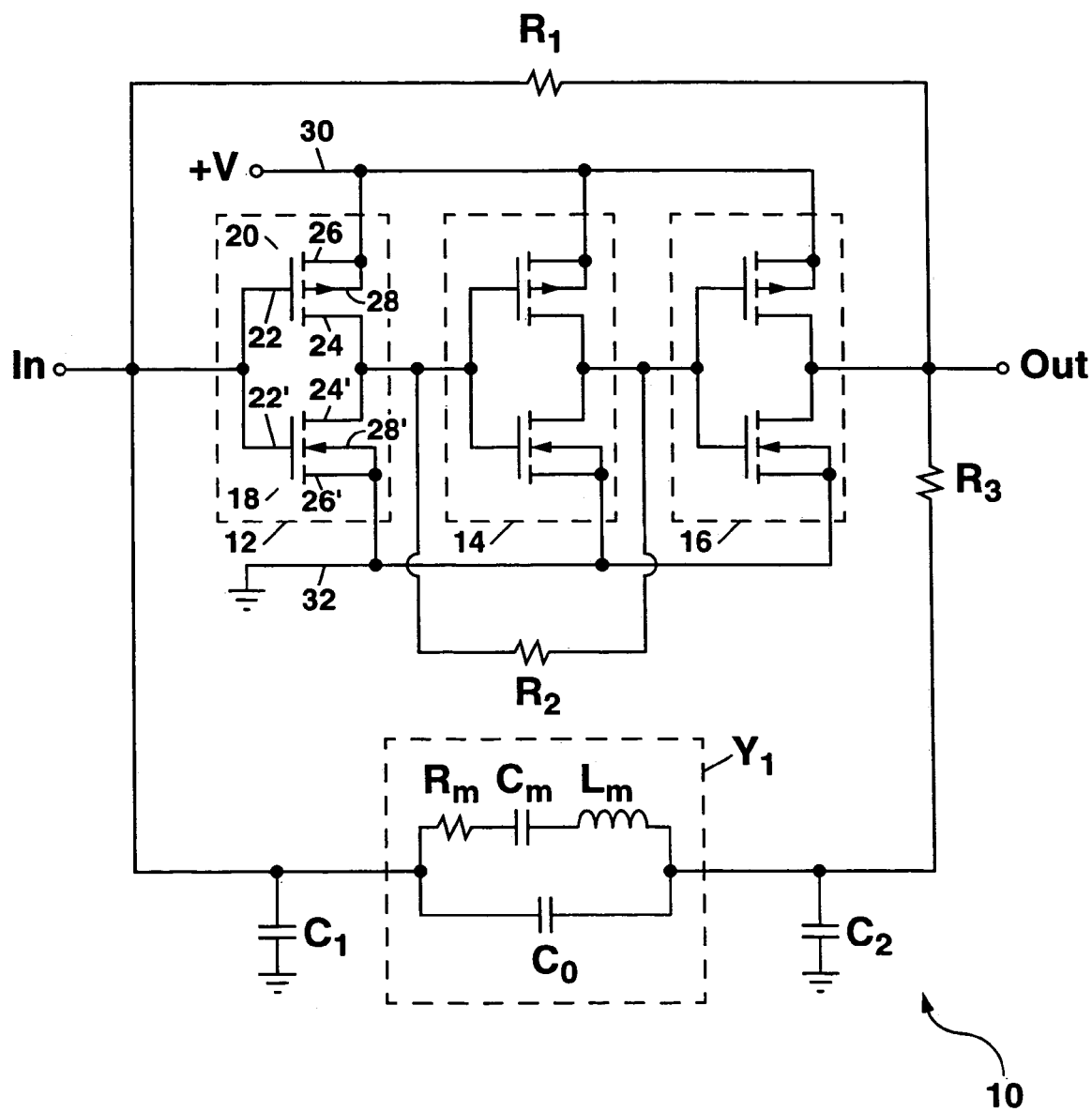
FIG. 3 shows a more detailed schematic diagram of an embodiment of the oscillator circuit of FIG. 2 formed using enhancement-mode CMOS transistors.

FIG. 3 shows an embodiment of the oscillator circuit 10 designed using three inverters 12, 14 and 16, having enhancement mode n-channel CMOS transistors 18 (termed herein NMOS transistors) and enhancement mode p-channel CMOS transistors 20 (termed herein PMOS transistors). Those skilled in the art will understand that depletion mode NMOS and PMOS transistors can be used in other embodiments of the present invention.

The oscillator circuit 10 in FIG. 3 also uses a voltage-limiting resistor $R_3$ which can be used, as needed, to limit power dissipation in the resonator $Y_1$. The voltage-limiting resistor $R_3$, which can have a resistance of 1–10 kΩ, can be useful to prevent excessive resonator power dissipation in the resonator $Y_1$.

In FIG. 3, a common gate, common drain configuration can be used for each inverter stage 12, 14 and 16. In each inverter stage, a gate 22 of the PMOS transistor 18 is connected to the gate 22' of the NMOS transistor 20; and a drain 24 of the PMOS transistor 18 is connected to the drain 24' of the NMOS transistor 20. A source 26 and a body 28 of the PMOS transistor 20 in each inverter stage is connected to a voltage supply rail 30 for connection to a positive supply voltage +V which can be, for example, 3.3 volts. A source 26' and a body 28' of the NMOS transistor 18 are also connected to another voltage supply rail 32 (i.e. a ground rail) as shown in FIG. 3.

FIG. 3 also shows an equivalent circuit for the resonator $Y_1$ which is connected between the output of the oscillator circuit 10 and its input, and which is also connected to capacitors $C_1$ and $C_2$, with an opposite side of each capacitor $C_1$ and $C_2$ being to the ground rail 32. The equivalent circuit for the resonator $Y_1$ consists of a motional arm having a resistance $R_m$, capacitance $C_m$ and inductance $L_m$ all connected in series, and with a static capacitance, $C_0$ being connected in parallel with the series connection of $R_m$, $C_m$ and $L_m$. In an AT-cut quartz crystal resonator having a resonant oscillation frequency of 20 MHz the values for the equivalent circuit can be, for example, $R_m=25\Omega$, $C_m=0.4$ pF, $L_m=0.16$ milliHenry (mH), and $C_0=3$ pF The values of $R_m$, $C_m$ and $L_m$ will, in general, be resonator dependent. Those skilled in the art will understand that the oscillator circuit 10 of the present invention can be used with other types of resonators known to the art including lithium niobate or lithium tantalate resonators, surface-acoustic-wave (SAW) resonators or microelectromechanical (MEM) resonators.

Figure 4:
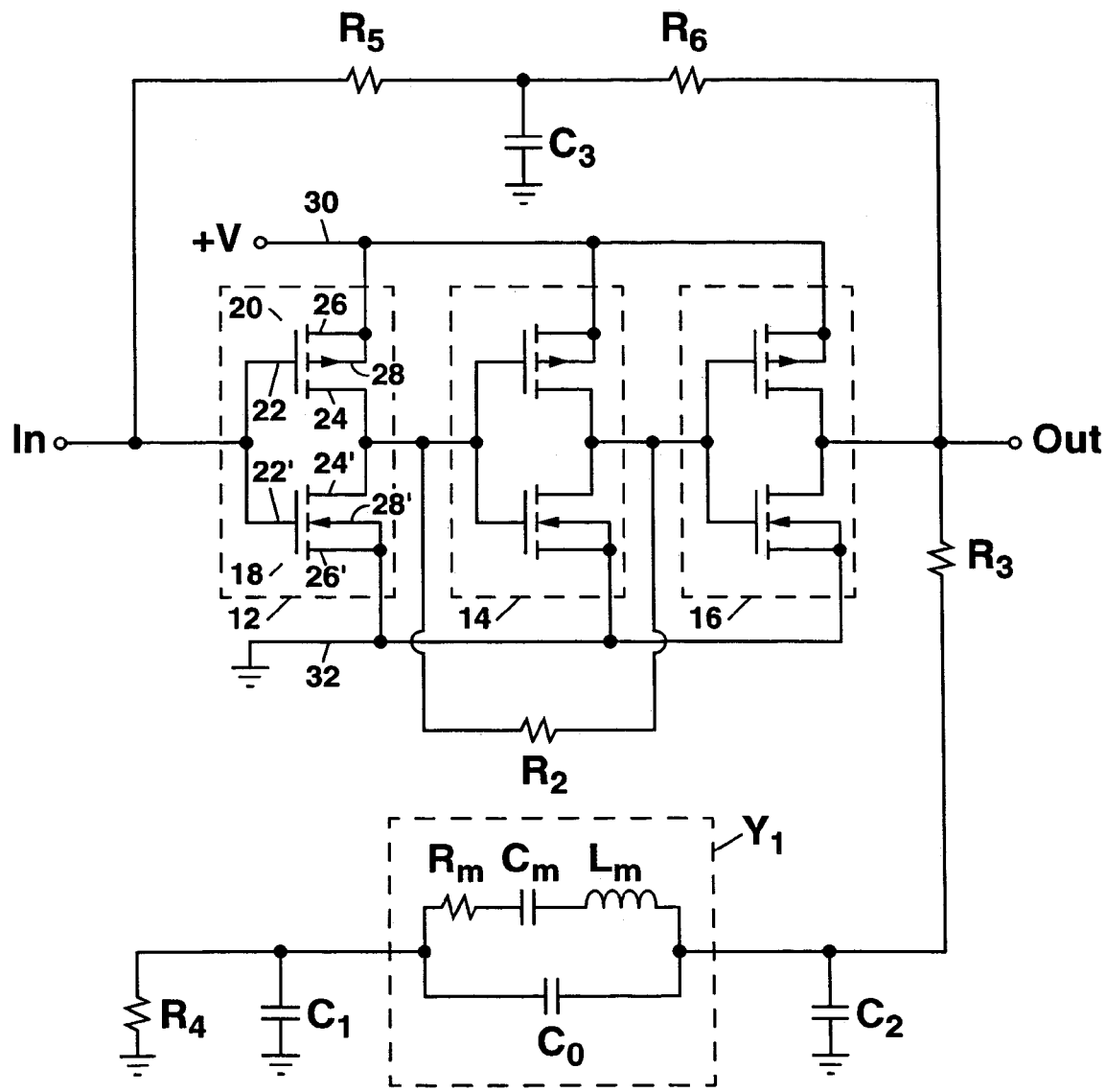
FIG. 4 shows an opened-up oscillator circuit of the present invention used to calculate phase and gain response curves as a function of frequency for various values of a second feedback resistor $R_2$ to illustrate that by including $R_2$ in the oscillator circuit of the present invention with a value of $\leq 100$ k$\Omega$ provides significant negative feedback so that circuit stability is improved and parasitic oscillation is prevented.

Gain and phase response curves can be calculated for the oscillator circuit 10 of FIG. 3 as a function of frequency. This can be done by modeling the circuit 10 using a computational circuit model (SPICE) after breaking the connection between the capacitor $C_1$ and the input of the oscillator circuit 10 as shown in FIG. 4. For this modeling, a load resistor $R_4$ corresponding to an input impedance of the first inverter 12 was connected to the capacitor $C_1$ as shown in FIG. 4; and a simulated variable-frequency voltage source was capacitively coupled into the input of the oscillator circuit 10. Additionally, two resistors $R_5$ and $R_6$ were substituted for the feedback resistor $R_1$, and a capacitor $C_3$ was connected to ground at a point where the two resistors $R_4$ and $R_5$ were connected together. The values of the various circuit components used in modeling the circuit of FIG. 4 are listed below in Table 1. In the model circuit in FIG. 4, the value of the second feedback resistor $R_2$ was varied to illustrate the effect of $R_2$ on the phase and gain of the circuit in FIG. 4, and the improvement provided by the oscillator circuit 10 of the present invention which includes a value of $R_2 \leq 100$ k$\Omega$.

TABLE 1

| Circuit Element | Value |
| --- | --- |
| $R_3$ | 1$\Omega$ |
| $R_4$ | 3 k$\Omega$ |
| $R_5$ | 2 k$\Omega$ |
| $R_6$ | 20 k$\Omega$ |
| $C_1$ | 50 pF |
| $C_2$ | 25 pF |
| $C_3$ | 10000 pF |
| $R_m$ | 25$\Omega$ |
| $C_m$ | 0.4 pF |
| $L_m$ | 0.158314 mH |
| $C_0$ | 3 pF |

Figure 5A:
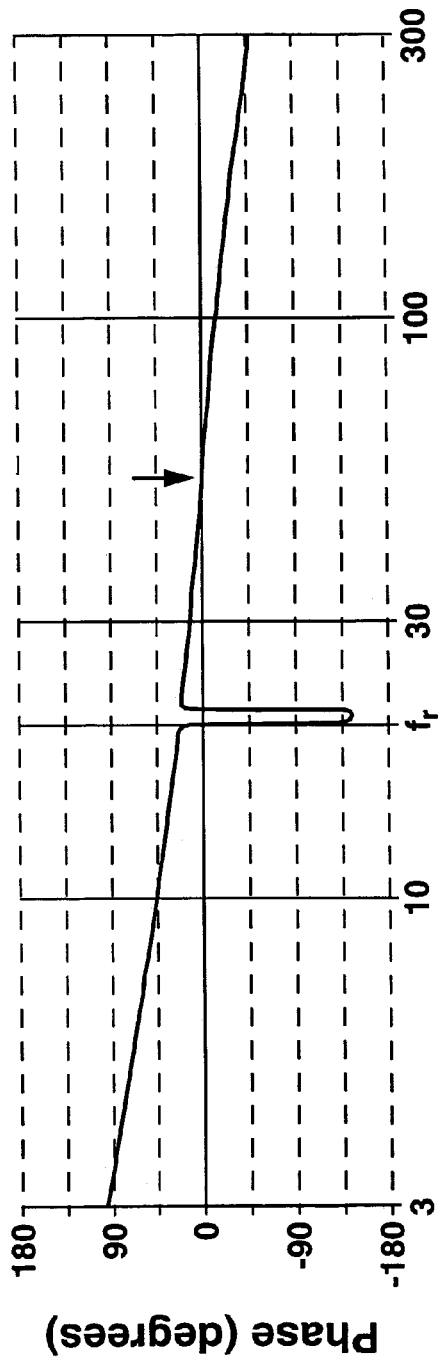
FIG. 5A shows a calculated phase response curve as a function of frequency for the opened-up oscillator circuit of FIG. 4 using a value of $R_2$=25 G$\Omega$ (gigaOhms) which is so large that $R_2$ is effectively absent from the circuit.
Figure 5B:
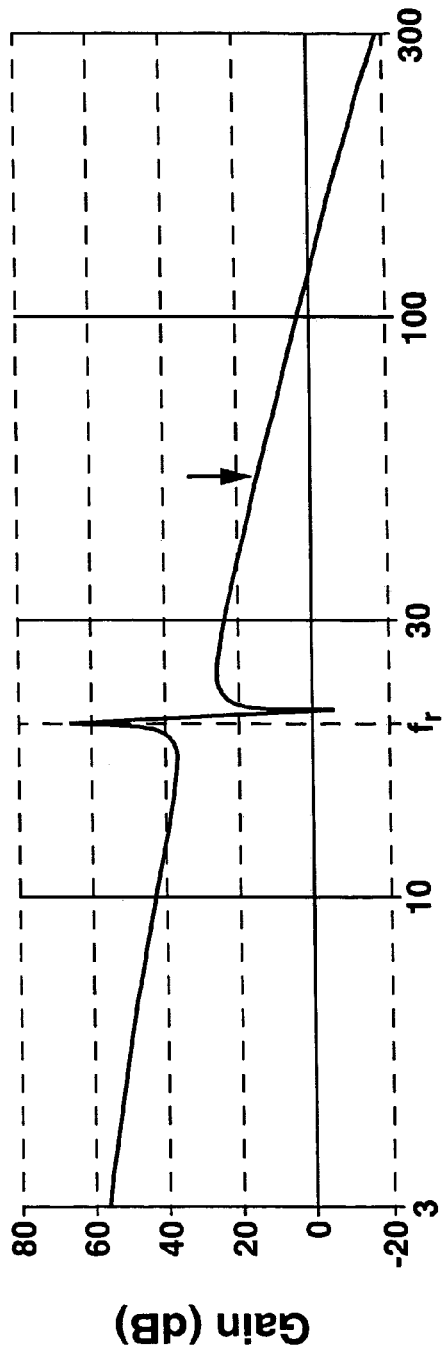
FIG. 5B shows a calculated gain response curve as a function of frequency for the opened-up oscillator circuit of FIG. 4 using a value of $R_2$=25 G$\Omega$ so that $R_2$ is effectively absent from the circuit.

FIGS. 5A and 5B show calculated phase and gain curves as a function of frequency in the range of 3–300 MHz for $R_2=25$ GigaOhms (G$\Omega$). This very large value of $R_2$ corresponds to effectively an open circuit in the place of $R_2$ to illustrate how parasitic oscillation can occur in the absence of the second feedback resistor $R_2$, or when the value of $R_2$ is too large. When the phase response curve in FIG. 5A crosses zero (i.e. a high-frequency zero-phase crossing as indicated by the downward-pointing arrow in FIG. 5A) at a frequency of about 50 MHz, the gain in FIG. 5B is still relatively large, being about 15 deciBells (dB). This relatively large excess gain at the high-frequency zero-phase crossing can produce a parasitic oscillation at this frequency (~50 MHz) which is far removed from the desired resonant oscillation frequency $f_r$, due to the resonator $Y_1$ where a maximum in the gain response curve in FIG. 5B coincides with a low-frequency zero-phase crossing in FIG. 5A as shown by a vertical dashed line in each figure. Such parasitic oscillation can severely affect the start-up reliability of any oscillator circuit wherein $R_2$ is not present, or is present with a very large value of resistance. Furthermore, even if oscillation were to occur at the resonant oscillation frequency $f_r$, of the resonator $Y_1$ in an oscillator circuit similar to that illustrated with reference to FIGS. 5A and 5B, the phase response curve at the low-frequency zero-phase crossing is not symmetric about 0° phase. This will result in a poor loaded quality factor Q for this circuit, and thus a low expected stability.

Figure 6A:
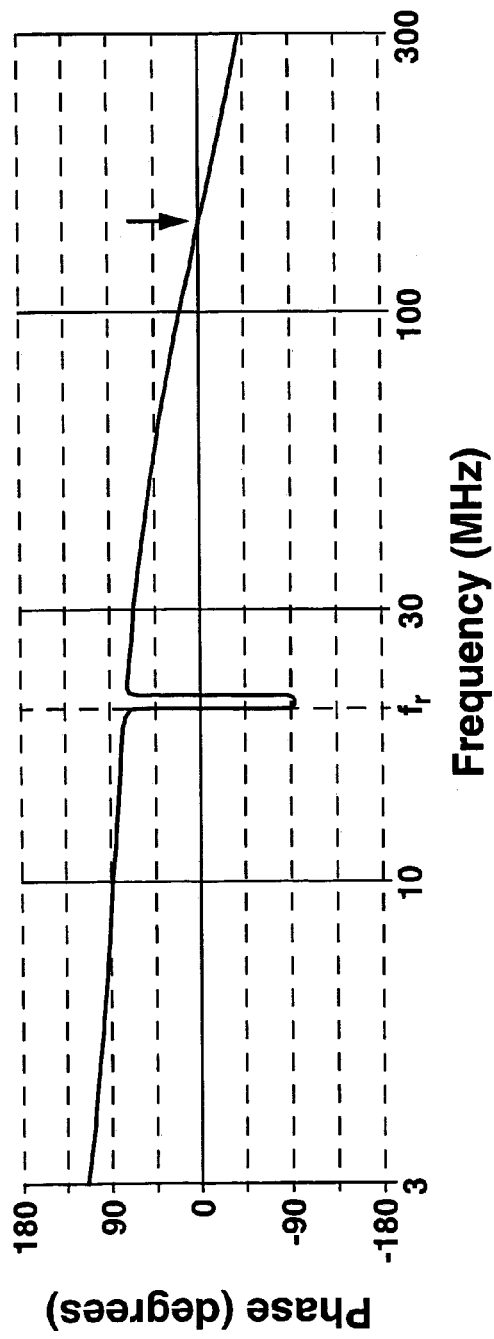
FIG. 6A shows a calculated phase response curve as a function of frequency for the opened-up oscillator circuit of FIG. 4 using a value of $R_2$=100 k$\Omega$ (kiloOhms).
Figure 6B:
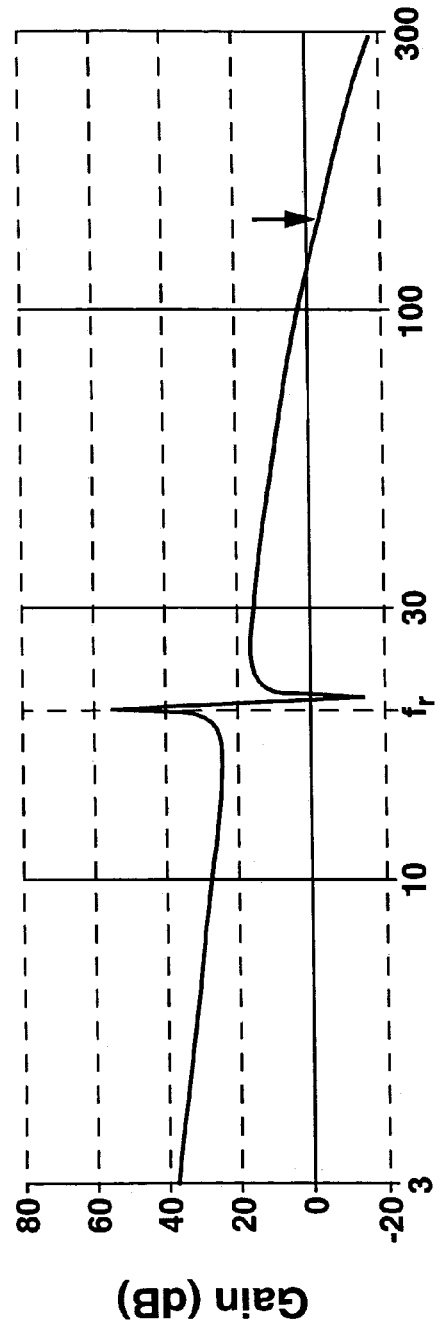
FIG. 6B shows a calculated gain response curve as a function of frequency for the opened-up oscillator circuit of FIG. 4 using a value of $R_2$=100 k$\Omega$.

In FIG. 6A, changing the value of $R_2$ to 100 k$\Omega$ has an effect of shifting the high-frequency zero-phase crossing in the phase response curve to a much higher frequency on the order of 140 MHz as indicated by the downward-pointing arrow. At this frequency where parasitic oscillation might be expected to occur, the corresponding gain response curve in FIG. 6B shows a negative gain indicating a loss of a few dB. This loss can prevent parasitic oscillation at the high-frequency zero-phase crossing so that the circuit will operate at an oscillation frequency $f_r$ determined by the resonator $Y_1$. Additionally, the phase response curve at the oscillation frequency $f_r$, where the low-frequency zero-phase crossing occurs is much better centered in a vertical direction about 0° phase so that any loading of the resonator $Y_1$ which changes a phase shift therein will have little, if any, effect on the stability of the oscillator circuit 10.

Figure 7A:
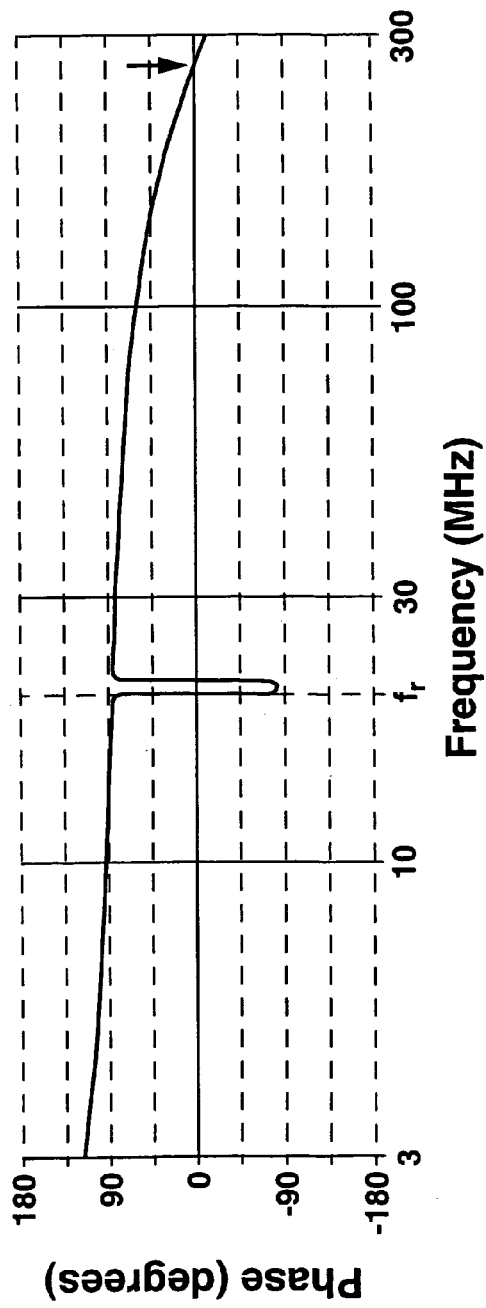
FIG. 7A shows a calculated phase response curve as a function of frequency for the opened-up oscillator circuit of FIG. 4 using a value of $R_2$=25 k$\Omega$.
Figure 7B:
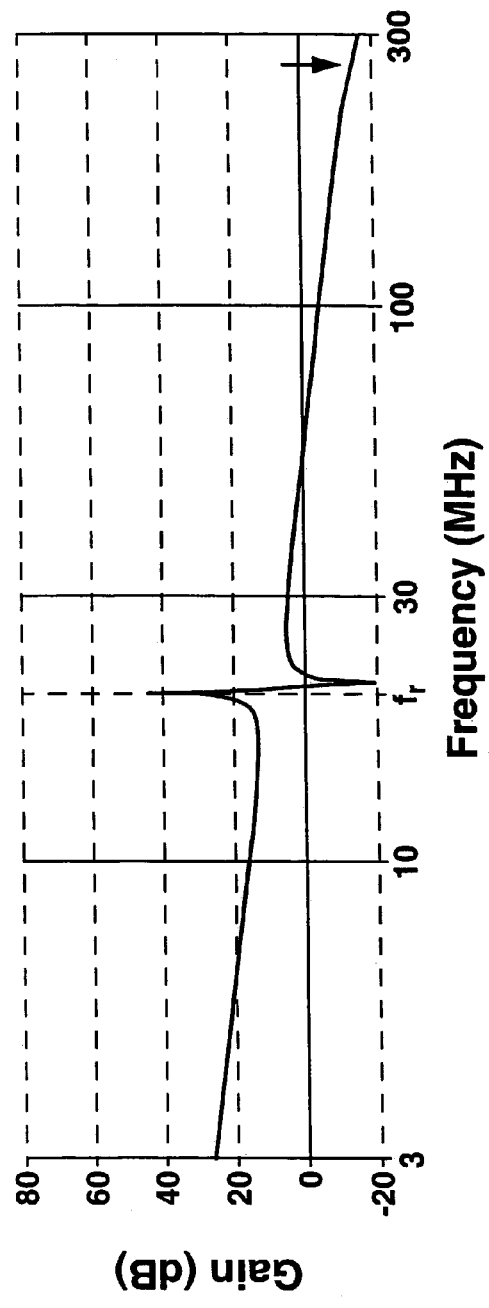
FIG. 7B shows a calculated gain response curve as a function of frequency for the opened-up oscillator circuit of FIG. 4 using a value of $R_2$=25 k$\Omega$.

In FIGS. 7A and 7B, reducing the value of $R_2$ further to 25 k$\Omega$ produces a further shift in the high-frequency zero-phase crossing to an even higher frequency on the order of 270 MHz. In this case, the gain is reduced further to about −15 dB (i.e. 15 dB of loss) at the high-frequency zero-phase crossing which ensures that no parasitic oscillation can occur in the oscillator circuit 10 with this value of $R_2$. This value of $R_2$ is expected to provide stable oscillation of the circuit 10 at the resonant oscillation frequency $f_r$ as controlled by the resonator $Y_1$. Additionally, the phase response curve at the low-frequency zero-phase crossing is even more symmetrical about 0° phase indicating even less susceptibility to any loading of the resonator $Y_1$. At the low-frequency zero-phase crossing, the oscillator circuit 10 with $R_2=25$ k$\Omega$ provides about 40 dB of excess gain which is more than adequate for a robust design for operation in the 10–50 MHz range, or at an even higher frequency.

Figure 8:
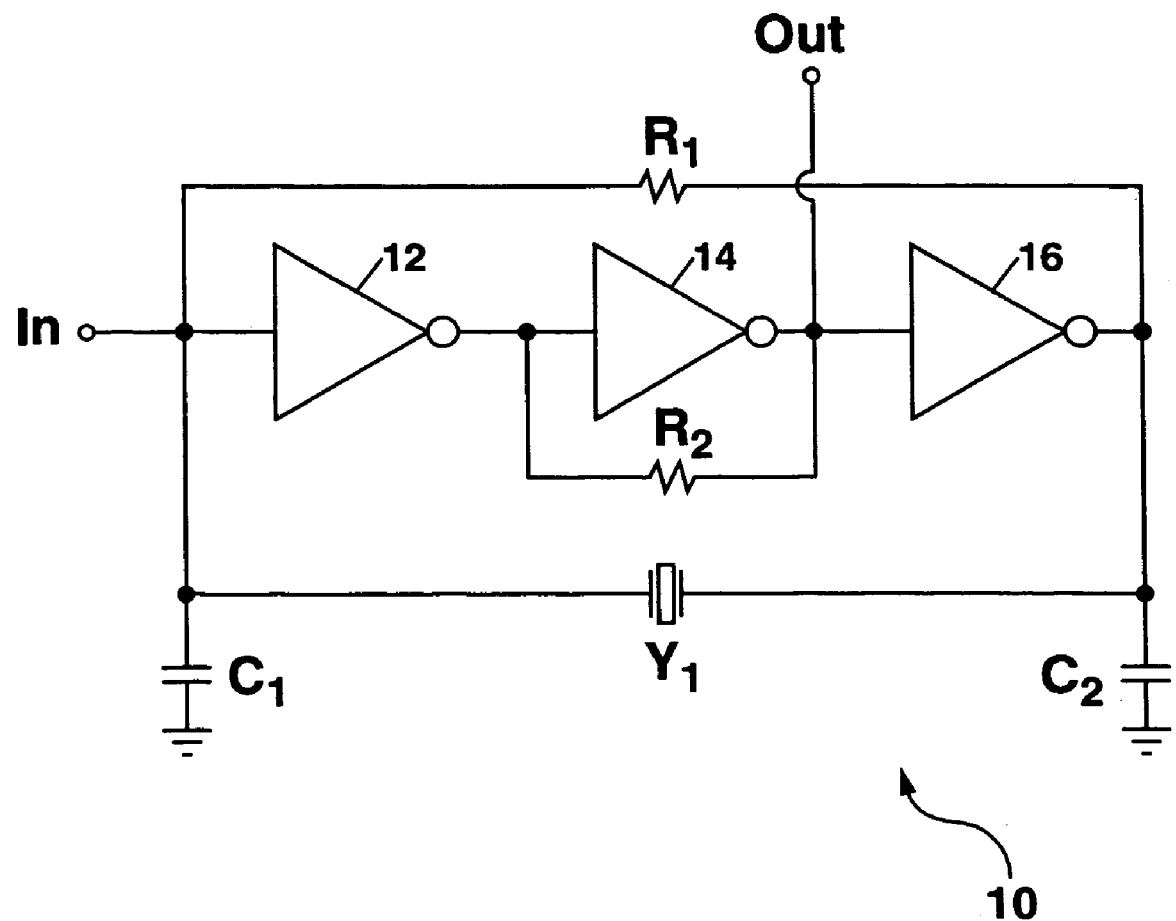
FIG. 8 shows another embodiment of a triple-inverter Pierce oscillator circuit according to the present invention with the oscillator output signal being taken at the output of the second inverter stage.

In the embodiments of the oscillator circuit 10 of the present invention previously described with reference to FIGS. 2 and 3, the oscillator output signal ("Out") is taken at the output of the third inverter stage 16. In other embodiments of the oscillator circuit 10, the oscillator output signal can be taken elsewhere in the oscillator circuit 10. In particular, the oscillator output signal can be taken at the output of the second inverter stage 14 as shown in FIG. 8 where the output impedance is lower than at the output of the third inverter stage 16. This makes the circuit 10 less susceptible to loading at the output due, for example, when the oscillator circuit 10 is used as a clock for a microprocessor.

In each embodiment of the oscillator circuit 10 described herein, a forth inverter stage (not shown) can be connected to the output of the oscillator circuit 10 for use in amplifying and buffering the oscillator output signal as needed.

Figure 9:
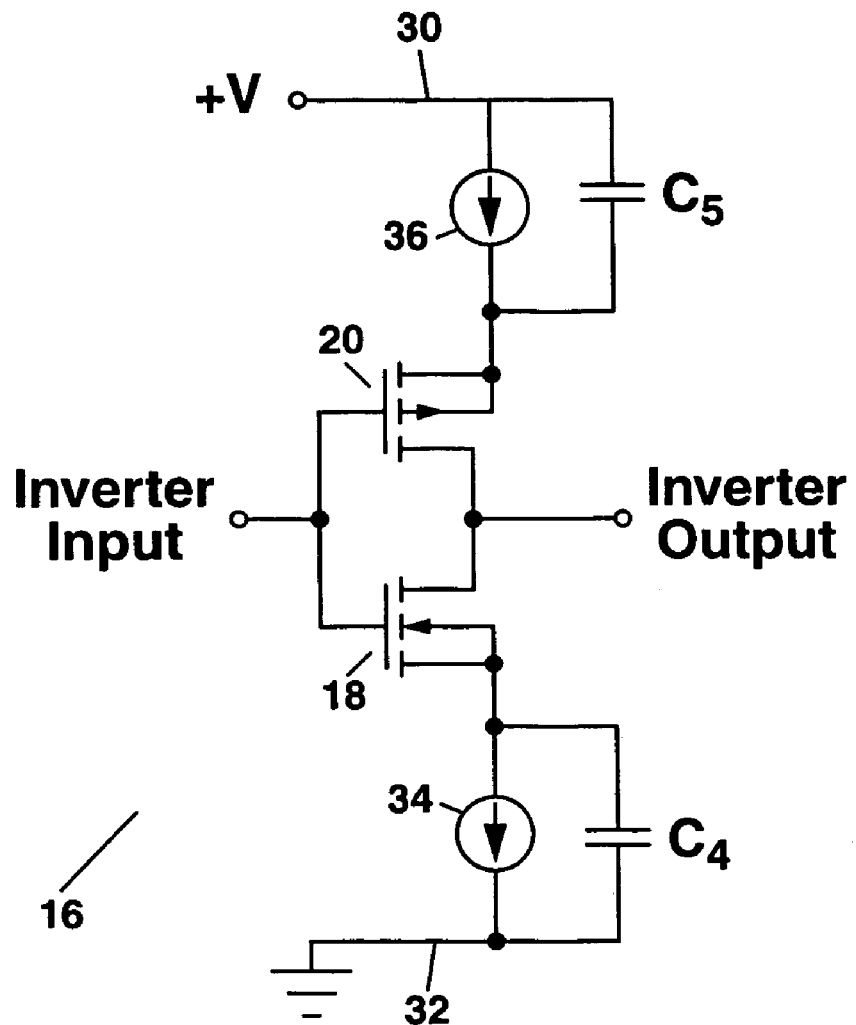
FIG. 9 shows an alternative arrangement for the third inverter stage which uses a pair of current sources to control a direct-current (dc) bias current and gain for the third inverter stage.

In yet other embodiments of the oscillator circuit 10 of the present invention, means can be provided for biasing each transistor within the third inverter stage 16 with a direct-current (dc) bias current. This can be done as shown in FIG. 9 by providing a first current source 34 between the NMOS transistor 18 and the ground rail 32 and a second current source 36 between the PMOS transistor 20 and the voltage supply rail 30. Each current source 34 and 36 can be implemented using FETs or CMOS transistors and can be voltage controlled so that the dc bias current and gain for the transistors 18 and 20 in the third inverter stage 16 can be independently adjusted as needed. Control of the dc bias current and gain of each transistor 18 and 20 in the third inverter stage 16 allows the generation of a more symmetric oscillator output signal, including a sinusoidal oscillator output signal which is free from any higher-order harmonic frequency components.

Capacitors $C_4$ and $C_5$ are also provided across each current source 34 and 36 in FIG. 9 for alternating-current (ac) coupling. Each capacitor, $C_4$ and $C_5$, can have a capacitance of, for example, 100 pF or less. Local feedback can also be optionally provided across the third inverter stage 16 in FIG. 9 using a feedback resistor (not shown) with a resistance $\leq 100$ k$\Omega$ connected between the common drains and gates in the third inverter stage 16 in a manner substantially identical to that previously described for the use of $R_2$ provided across the second inverter stage 14. Such a feedback resistor across the third inverter stage 16 can lower the transistor gain of the third inverter stage 16 slightly to further improve the circuit stability.

When implementing the various oscillator circuits 10 described herein as a CMOS integrated circuit, each resistor can take the form of a high-impedance NMOS or PMOS transistor. Alternately, each resistor can comprise a polycrystalline silicon (also termed polysilicon) resistor which is formed from a layer of deposited and patterned doped polycrystalline silicon during integrated circuit fabrication using processes which are well-known to the art. Each field-effect transistor inverter stage 12, 14 and 16, together with the various resistors and capacitors in the oscillator circuit 10 can all be formed as an integrated circuit, with the resonator $Y_1$ being separately provided and connected to the integrated circuit to complete the oscillator circuit 10. This allows flexibility for selecting a resonator $Y_1$ at a particular oscillation frequency while saving space and manufacturing cost when fabricating the oscillator circuit 10. As an example, for fabrication with 0.35 μm CMOS technology, each NMOS transistor can have gate and channel dimensions of 1×20 μm, and each PMOS transistor can have gate and channel dimensions of 1×60 μm. Those skilled in the art will understand that each oscillator circuit 10 disclosed herein can also be formed as an integrated circuit using metal-insulator-semiconductor field-effect transistors (MISFETs). Additionally, each oscillator circuit 10 disclosed herein can be fabricated using discrete or hybrid components.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A CMOS oscillator circuit for use with a resonator, which is connected in a feedback configuration between an input and an output of the CMOS oscillator circuit, comprising:
    (a) three serially-connected dc-coupled CMOS inverters, with each CMOS inverter having an input and an output, and with the output of a first CMOS inverter being connected to the input of a second CMOS inverter, and with the output of the second CMOS inverter being connected to the input of a third CMOS inverter;
    (b) a first feedback resistor connected between the output of the third CMOS inverter, which forms the output of the CMOS oscillator circuit, and the input of the first CMOS inverter, which forms the input of the CMOS oscillator circuit;
    (c) a second feedback resistor connected between the output of the second CMOS inverter and the input of the second CMOS inverter to provide a positive resistance which decreases the gain of the second CMOS inverter to prevent any parasitic oscillation in the CMOS oscillator circuit;
    (d) a first capacitor connected at one side thereof to the input of the CMOS oscillator circuit, and at another side thereof to a voltage supply rail; and
    (e) a second capacitor connected at one side thereof to the output of the CMOS oscillator circuit, and at another side thereof to the voltage supply rail.

2. The CMOS oscillator circuit of claim 1 wherein the second feedback resistor has a resistance in the range of 1–100 kiloOhms (k$\Omega$).

3. The CMOS oscillator circuit of claim 1 wherein the first feedback resistor has a resistance in the range of 10–100 kiloOhms (k$\Omega$).

4. The CMOS oscillator circuit of claim 1 wherein each capacitor has a capacitance of 100 picoFarads (pF) or less.

5. The CMOS oscillator circuit of claim 1 wherein the second capacitor is connected to the output of the CMOS oscillator circuit through a voltage-limiting resistor.

6. The CMOS oscillator circuit of claim 5 wherein the voltage-limiting resistor has a resistance of 1–10 kiloOhms (k$\Omega$).

7. The CMOS oscillator circuit of claim 1 wherein each CMOS inverter comprises an NMOS transistor and a PMOS transistor connected in a common gate and common drain configuration.

8. The CMOS oscillator circuit of claim 7 further comprising means for biasing the NMOS and PMOS transistors within the third CMOS inverter with a direct-current (dc) bias current.

9. The CMOS oscillator circuit of claim 8 wherein the means for biasing comprises a current source connected to each NMOS and PMOS transistor within the third CMOS inverter.

10. The CMOS oscillator circuit of claim 1 wherein the resonator comprises a crystal resonator.

11. The CMOS oscillator circuit of claim 1 wherein an oscillation frequency produced by the CMOS oscillator circuit is in the range of 10–50 megaHertz (MHz).

12. The CMOS oscillator circuit of claim 1 wherein the three serially-connected CMOS inverters, the first and second feedback resistors, and the first and second capacitors are formed as an integrated circuit.

13. The CMOS oscillator circuit of claim 1 wherein each feedback resistor comprises a polysilicon resistor.

14. An oscillator circuit, capable of generating a resonator-controlled oscillator output signal, comprising:
   (a) three dc-coupled field-effect transistor (FET) inverter stages, each FET inverter stage having an input and an output, with the three FET inverter stages being connected in series, with the output of a first FET inverter stage being connected to the input of a second FET inverter stage, and with the output of the second FET inverter stage being connected to the input of a third FET inverter stage;
   (b) a first feedback resistor connected between the output of the third FET inverter stage and the input of the first FET inverter stage to bias the oscillator circuit for start-up of oscillation;
   (c) a second feedback resistor connected between the output of the second FET inverter stage and the input of the second FET inverter stage to provide a positive resistance which decreases the gain of the second PET inverter stage to prevent parasitic oscillation of the oscillator circuit;
   (d) a first capacitor connected between the input of the first FET inverter stage and a voltage supply rail;
   (e) a second capacitor connected between the output of the third FET inverter stage and the voltage supply rail; and
   (f) a resonator connected between the first and second capacitors to control an oscillation frequency of the oscillator circuit, with the generated resonator-controlled oscillator output signal being provided at the output of the second or third FET inverter stage.

15. The oscillator circuit of claim 14 wherein the second feedback resistor has a resistance in the range of 1–100 kiloOhms (kΩ).

16. The oscillator circuit of claim 14 wherein the first feedback resistor has a resistance in the range of 10–100 kiloOhms (kΩ).

17. The oscillator circuit of claim 14 wherein each capacitor has a capacitance of 100 picoFarads (pF) or less.

18. The oscillator circuit of claim 14 wherein the second capacitor is connected to the output of the third FET inverter stage through a voltage-limiting resistor.

19. The oscillator circuit of claim 18 wherein the voltage-limiting resistor has a resistance of 1–10 kiloOhms (kΩ).

20. The oscillator circuit of claim 14 wherein each FET inverter stage comprises an N-channel field-effect transistor and a P-channel field-effect transistor connected in a common gate and common drain configuration.

21. The oscillator circuit of claim 20 further comprising means for biasing each transistor within the third FET inverter stage with a direct-current (dc) bias current.

22. The oscillator circuit of claim 21 wherein the means for biasing comprises a current source connected to provide the dc bias current to each transistor within the third FET inverter stage.

23. The oscillator circuit of claim 14 wherein the resonator comprises a crystal resonator.

24. The oscillator circuit of claim 14 wherein the oscillation frequency is in the range of 10–50 megahertz (MHz).

25. The oscillator circuit of claim 14 wherein the three PET inverter stages, the first and second feedback resistors, and the first and second capacitors are formed as an integrated circuit.

26. The oscillator circuit of claim 25 wherein the integrated circuit comprises a complementary metal-oxide-semiconductor (CMOS) integrated circuit, with each FET inverter stage comprising an NMOS transistor and a PMOS transistor connected together in a common gate, common drain configuration.

27. The oscillator circuit of claim 26 wherein each feedback resistor comprises a polysilicon resistor.

* * * * *